(12) United States Patent
Koek et al.

(10) Patent No.: US 9,715,183 B2
(45) Date of Patent: Jul. 25, 2017

(54) DEVICE, LITHOGRAPHIC APPARATUS, METHOD FOR GUIDING RADIATION AND DEVICE MANUFACTURING METHOD

(71) Applicant: ASML Netherlands B.V., Veldhoven (NL)

(72) Inventors: Wouter Dick Koek, Zoetermeer (NL); Arno Jan Bleeker, Westerhoven (NL); Erik Roelof Loopstra, Eindhoven (NL); Heine Melle Mulder, Veldhoven (NL); Erwin John Van Zwet, Pijnacker (NL); Dries Smeets, Hasselt (BE); Robert Paul Ebeling, Zoetermeer (NL)

(73) Assignee: ASML NETHERLANDS B.V., Veldhoven (NL)

( * ) Notice: Subject to any disclaimer, the term of this patent is extended or adjusted under 35 U.S.C. 154(b) by 284 days.

(21) Appl. No.: 14/365,549

(22) PCT Filed: Jan. 24, 2013

(86) PCT No.: PCT/EP2013/051355
§ 371 (c)(1),
(2) Date: Jun. 13, 2014

(87) PCT Pub. No.: WO2013/124114
PCT Pub. Date: Aug. 29, 2013

(65) Prior Publication Data
US 2014/0347641 A1    Nov. 27, 2014

Related U.S. Application Data

(60) Provisional application No. 61/602,491, filed on Feb. 23, 2012.

(51) Int. Cl.
*G03B 27/52* (2006.01)
*G03F 7/20* (2006.01)
*G02B 6/42* (2006.01)

(52) U.S. Cl.
CPC ....... *G03F 7/70891* (2013.01); *G02B 6/4296* (2013.01); *G03F 7/704* (2013.01);
(Continued)

(58) Field of Classification Search
CPC . G02B 6/4296; G03F 7/7015; G03F 7/70275; G03F 7/70291; G03F 7/70391; G03F 7/704; G03F 7/70891; Y10T 29/49
(Continued)

(56) References Cited

U.S. PATENT DOCUMENTS 4,090,206 A    5/1978  Pfeifer
4,447,126 A    5/1984  Heidrich
(Continued)

FOREIGN PATENT DOCUMENTS

DE    4315580    11/1994
DE    4315581    11/1994
(Continued)

OTHER PUBLICATIONS

Korean Office Action mailed Nov. 13, 2015 in corresponding Korean Patent Application No. 10-2014-7019922.
(Continued)

*Primary Examiner* — Toan Ton
*Assistant Examiner* — Mona M Sanei
(74) *Attorney, Agent, or Firm* — Pillsbury Winthrop Shaw Pittman LLP (57) ABSTRACT

A device having a waveguide formed of a continuous body of material that is transparent to radiation that passes through the waveguide, wherein the body has an input surface and an output surface, and a cooler configured to cool the input surface and/or the output surface. An exposure apparatus having a programmable patterning device that comprises a plurality of radiation emitters, configured to provide a plurality of radiation beams; and a projection
(Continued)

system, comprising a stationary part and a moving part, configured to project the plurality of radiation beams onto locations on a target that are selected based on a pattern, wherein at least one of the radiation emitters comprises a waveguide configured to output a radiation beam that comprises unpolarized and/or circularly polarized radiation.

20 Claims, 7 Drawing Sheets

(52) U.S. Cl.
CPC ........ *G03F 7/7015* (2013.01); *G03F 7/70275* (2013.01); *G03F 7/70291* (2013.01); *G03F 7/70391* (2013.01); *Y10T 29/49* (2015.01)

(58) Field of Classification Search
USPC ........... 355/30, 53, 67, 71; 35/30, 53, 67, 71
See application file for complete search history.

(56) References Cited

U.S. PATENT DOCUMENTS

| | | | |
|---|---|---|---|
| 4,520,472 A | 5/1985 | Reno | |
| 4,525,729 A | 6/1985 | Agulnek | |
| 4,640,573 A | 2/1987 | Kataoka | |
| 4,780,730 A | 10/1988 | Dodge | |
| 4,796,038 A | 1/1989 | Allen | |
| 4,821,002 A * | 4/1989 | Luly | H01P 1/165 333/21 A |
| 4,844,568 A | 7/1989 | Suzuki | |
| 4,864,216 A | 9/1989 | Kalata | |
| 4,952,949 A | 8/1990 | Uebbing | |
| 5,051,762 A | 9/1991 | Lea | |
| 5,200,722 A * | 4/1993 | Wolf | H01P 1/08 333/252 |
| 5,216,247 A | 6/1993 | Wang | |
| 5,216,534 A | 6/1993 | Boardman | |
| 5,229,872 A | 7/1993 | Mumola | |
| 5,296,891 A | 3/1994 | Vogt | |
| 5,457,488 A | 10/1995 | Nakamura | |
| 5,481,392 A | 1/1996 | Damer | |
| 5,523,193 A | 6/1996 | Nelson | |
| 5,568,320 A | 10/1996 | Rees | |
| 5,589,973 A | 12/1996 | King | |
| 5,610,754 A | 3/1997 | Gheen | |
| 5,668,587 A | 9/1997 | Hammond | |
| 5,705,788 A | 1/1998 | Beyer | |
| 5,838,024 A | 11/1998 | Masuda | |
| 5,840,451 A | 11/1998 | Moore | |
| 6,037,965 A | 3/2000 | Gross | |
| 6,133,986 A | 10/2000 | Johnson | |
| 6,167,177 A | 12/2000 | Sandström | |
| 6,204,875 B1 | 3/2001 | De Loor | |
| 6,268,613 B1 | 7/2001 | Cantu | |
| 6,310,710 B1 | 10/2001 | Shahar | |
| 6,313,862 B1 | 11/2001 | Berner | |
| 6,466,352 B1 | 10/2002 | Shahar | |
| 6,531,681 B1 | 3/2003 | Markle | |
| 6,559,438 B1 | 5/2003 | Drobot | |
| 6,683,727 B1 | 1/2004 | Goring | |
| 6,765,647 B1 | 7/2004 | Nishi | |
| 6,795,169 B2 | 9/2004 | Tanaka | |
| 6,967,711 B2 | 11/2005 | Gui | |
| 7,116,402 B2 | 10/2006 | Gui | |
| 7,684,008 B2 | 3/2010 | De Smit et al. | |
| 7,969,636 B2 | 6/2011 | Naito | |
| 2002/0115021 A1 | 8/2002 | Piao | |
| 2002/0126479 A1 | 9/2002 | Zhai | |
| 2002/0171047 A1 | 11/2002 | Chan | |
| 2003/0043582 A1 | 3/2003 | Chan | |
| 2003/0091277 A1 | 5/2003 | Mei | |
| 2004/0124372 A1 | 7/2004 | Gil | |
| 2004/0135159 A1 | 7/2004 | Siegel | |
| 2004/0257629 A1 | 12/2004 | Noehte | |
| 2005/0024609 A1 | 2/2005 | De Smit et al. | |
| 2005/0167508 A1 | 8/2005 | Syms | |
| 2006/0001855 A1 | 1/2006 | Lof | |
| 2006/0103719 A1 | 5/2006 | Katzir | |
| 2006/0108508 A1 | 5/2006 | Khalid | |
| 2007/0034890 A1 | 2/2007 | Daschner | |
| 2007/0182808 A1 | 8/2007 | Stiblert | |
| 2007/0296936 A1 | 12/2007 | Kato | |
| 2008/0042969 A1 | 2/2008 | Baker | |
| 2008/0047445 A1 | 2/2008 | Berner | |
| 2008/0113298 A1 * | 5/2008 | Baumann | G03F 7/322 430/302 |
| 2008/0137051 A1 | 6/2008 | Maly | |
| 2008/0160211 A1 | 7/2008 | Siegel | |
| 2008/0205845 A1 * | 8/2008 | Wang | G02B 6/34 385/140 |
| 2008/0210888 A1 | 9/2008 | Inoue | |
| 2008/0225260 A1 * | 9/2008 | Klaassen | G03F 7/70566 355/71 |
| 2009/0296063 A1 | 12/2009 | Opower | |
| 2010/0142757 A1 | 6/2010 | Sandstrom | |
| 2010/0265557 A1 | 10/2010 | Sallander | |
| 2011/0051211 A1 | 3/2011 | Walther | |
| 2011/0188016 A1 | 8/2011 | De Jager | |
| 2012/0320359 A1 | 12/2012 | Van Zwet et al. | |
| 2012/0324911 A1 * | 12/2012 | Shedd | F25B 25/00 62/62 |
| 2014/0071421 A1 | 3/2014 | De Jager et al. | |
| 2014/0160452 A1 | 6/2014 | De Jager et al. | |

FOREIGN PATENT DOCUMENTS

| | | |
|---|---|---|
| DE | 19813127 | 10/1998 |
| EP | 1 835 347 | 9/2007 |
| EP | 2 261 741 | 12/2010 |
| JP | 57-152273 | 9/1982 |
| JP | S62-299908 | 12/1987 |
| JP | H04-086710 | 3/1992 |
| JP | 06-275936 | 9/1994 |
| JP | 07074503 A * | 3/1995 |
| JP | H08-292339 | 11/1996 |
| JP | 2002-131588 | 5/2002 |
| JP | 2003-220484 | 8/2003 |
| JP | 2005-005713 | 1/2005 |
| JP | 2005-099062 | 4/2005 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104171 | 9/2011 |
| WO | 2011/104176 | 9/2011 |

OTHER PUBLICATIONS

Japanese Office Action dated Aug. 18, 2015 in corresponding Japanese Patent Application No. 2014-558046.
International Preliminary Report on Patentability mailed Sep. 4, 2014 in corresponding International Patent Application No. PCT/EP2013/051355.
Chinese Office Action dated Jun. 2, 2015 in corresponding Chinese Patent Application No. 2013800100041.
LOT-Oriel Group Europe, "MicroWriter™ Laser Lithography System," www.LOT-Oriel.com (2 pp, date unknown, obtained Jul. 2010).
"Large-Plate Exposure System FX-63S," Nikon Web Magazine: Nikon Technology Outlook, Sep. 24, 2004, pp. 1-4.

(56) References Cited

OTHER PUBLICATIONS

JetScreen DX Flat Brochure (6 pp., date unknown, obtained Feb. 2009).
"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.
International Search Report and Written Opinion mailed May 8, 2013 in International Patent Application No. PCT/EP2013/051355.

* cited by examiner

DEVICE, LITHOGRAPHIC APPARATUS, METHOD FOR GUIDING RADIATION AND DEVICE MANUFACTURING METHOD

CROSS-REFERENCE TO RELATED APPLICATIONS

This application claims the benefit of U.S. provisional application 61/602,491, which was filed on Feb. 23, 2012 and which is incorporated herein in its entirety by reference.

FIELD

The present invention relates to a device, a lithographic or exposure apparatus, a method for guiding radiation and a method for manufacturing a device.

BACKGROUND

A lithographic or exposure apparatus is a machine that applies a desired pattern onto a substrate or part of a substrate. The apparatus may be used, for example, in the manufacture of integrated circuits (ICs), flat panel displays and other devices or structures having fine features. In a conventional lithographic or exposure apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micro-mirror arrays, liquid crystal display (LCD) arrays, grating light valve arrays, arrays of self-emissive contrast devices and the like. A programmable patterning device could also be formed from an electro-optical deflector, configured for example to move spots of radiation projected onto a target (e.g., the substrate) or to intermittently direct a radiation beam away from the target (e.g., the substrate), for example to a radiation beam absorber. In either such arrangement, the radiation beam may be continuous.

SUMMARY

A maskless lithographic or exposure apparatus may be provided with, for example, an optical column capable of creating a pattern on a target portion of, e.g., a substrate. The optical column may be provided with a self emissive contrast device configured to emit a beam and a projection system configured to project at least a portion of the beam onto the target portion. The apparatus may be provided with an actuator to move the optical column or a part thereof with respect to the target. Thereby, the beam may be moved with respect to the target. By switching "on" or "off" the self-emissive contrast device during the movement, a pattern on the substrate may be created.

According to an embodiment of the invention, there is provided a device comprising: a waveguide formed of a continuous body of material that is transparent to radiation that passes through the waveguide, wherein the body has an input surface and an output surface; and a cooler configured to cool the input surface and/or the output surface.

According to an embodiment of the invention, there is provided a lithographic or exposure apparatus, comprising: a programmable patterning device that comprises a plurality of radiation emitters, configured to provide a plurality of radiation beams; and a projection system, comprising a stationary part and a moving part, configured to project the plurality of radiation beams onto locations on a target that are selected based on a pattern, wherein at least one of the radiation emitters comprises a waveguide configured to output a radiation beam that comprises unpolarized and/or circularly polarized radiation.

According to an embodiment of the invention, there is provided a method for guiding radiation comprising: guiding radiation through a waveguide formed of a continuous body of material that is transparent to the radiation, wherein the body has an input surface and an output surface; and cooling the input surface and/or the output surface.

According to an embodiment of the invention, there is provided a device manufacturing method comprising: providing a plurality of radiation beams from a plurality of radiation emitters of a programmable patterning device; and projecting the plurality of radiation beams onto locations on a target that are selected based on a pattern, wherein at least one of the radiation emitters comprises a waveguide configured to output a radiation beam that comprises unpolarized and/or circularly polarized radiation.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to an apparatus that may include a programmable patterning device that may, for example, be comprised of an array or arrays of self-emissive contrast devices. Further information regarding such an apparatus may be found in PCT patent application publication no. WO 2010/032224 A2, U.S. patent application publication no. US 2011-0188016, U.S. patent application No. 61/473,636 and U.S. patent application No. 61/524,190 which are hereby incorporated by reference in their entireties. An embodiment of the present invention, however, may be used with any form of programmable patterning device including, for example, those discussed above.

Figure 1:
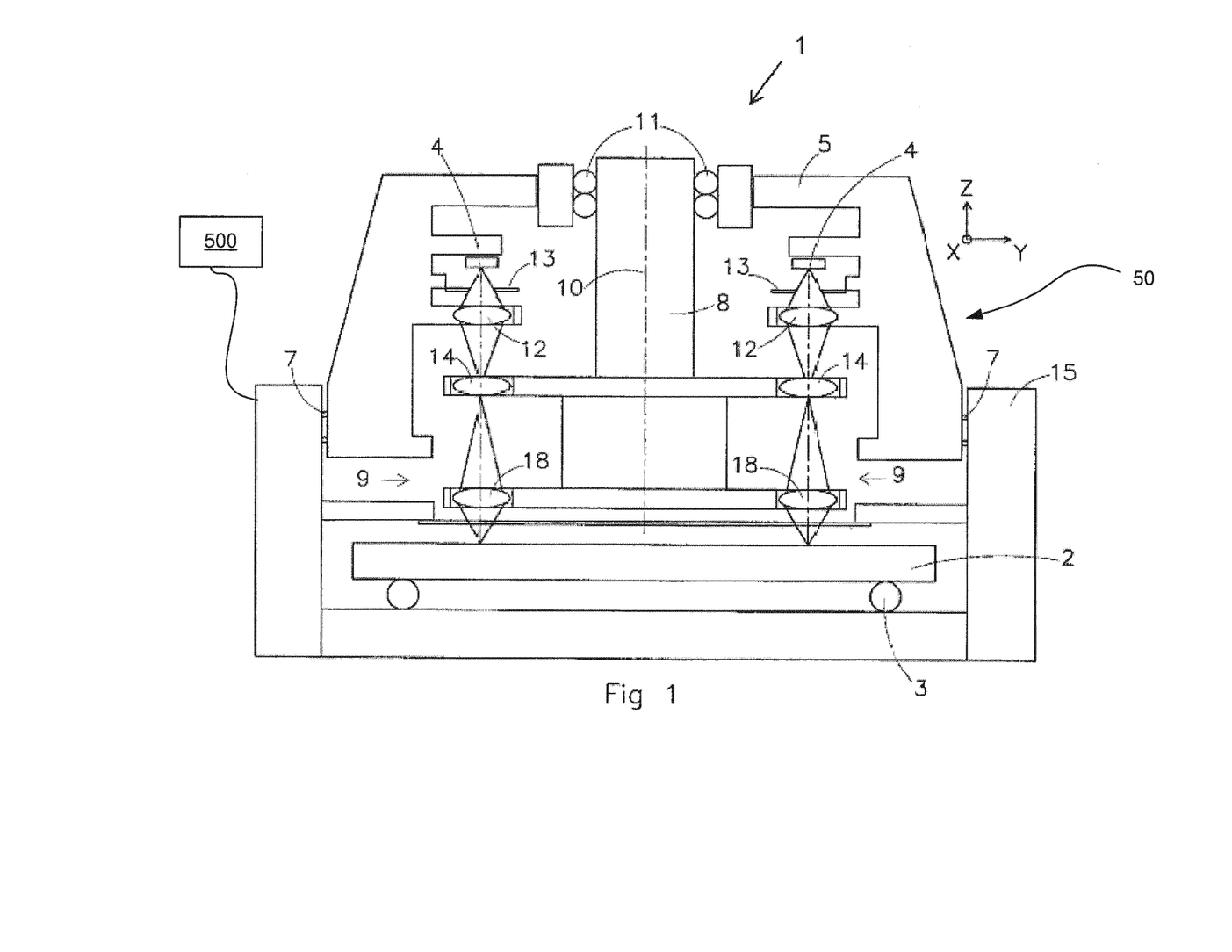
FIG. 1 depicts a part of a lithographic or exposure apparatus according to an embodiment of the invention.

FIG. 1 schematically depicts a schematic cross-sectional side view of a part of a lithographic or exposure apparatus. In this embodiment, the apparatus has individually controllable elements substantially stationary in the X-Y plane as discussed further below although it need not be the case. The apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the apparatus is suitable for roll-to-roll manufacturing.

The apparatus 1 further comprises a plurality of individually controllable self-emissive contrast devices 4 configured to emit a plurality of beams. In an embodiment, the self-emissive contrast device 4 is a radiation emitter, e.g. a radiation emitting diode, such as a light emitting diode (LED), an organic LED (OLED), a polymer LED (PLED), a fiber laser or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-250 mW, and optionally an output power of at least 50 mW. In an embodiment the output power of a device 60, that may comprise a self-emissive contrast device 4, is greater than 250 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
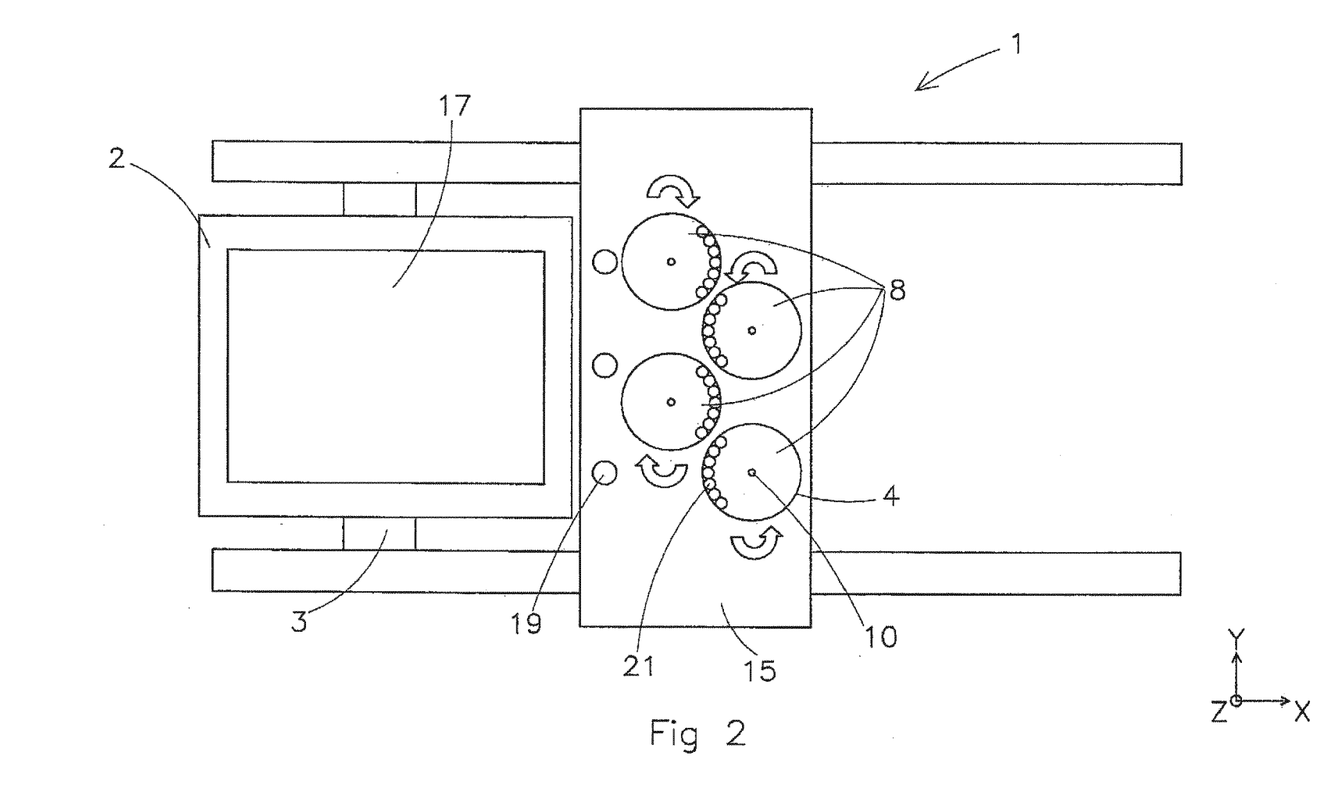
FIG. 2 depicts a top view of a part of the apparatus of FIG. 1 according to an embodiment of the invention.

The self-emissive contrast devices 4 are arranged on a frame 5 and may extend along the Y-direction and/or the X direction. While one frame 5 is shown, the apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of, e.g., the substrate. The self-emissive contrast device 4 and the projection system form an optical column. The apparatus 1 may comprise an actuator (e.g. motor) 11 to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator (e.g. motor) 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4 or of an adjacent lens 12 and a self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on, e.g., the substrate is scanned over a portion of the substrate. By simultaneously moving the substrate on the substrate table 2 underneath the optical column, the portion of the substrate 17, which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

A controller 500 shown in FIG. 1 controls the overall operations of the lithographic or exposure apparatus and in particular performs an optimization process described further below. Controller 500 can be embodied as a suitably-programmed general purpose computer comprising a central processing unit and volatile and non-volatile storage. Optionally, the controller 500 may include one or more input and output devices such as a keyboard and screen, one or more network connections and/or one or more interfaces to the various parts of the lithographic or exposure apparatus. It will be appreciated that a one-to-one relationship between controller and lithographic or exposure apparatus is not necessary. In an embodiment of the invention one controller can control multiple lithographic or exposure apparatuses. In an embodiment of the invention, multiple networked computers can be used to control one lithographic or exposure apparatus. The controller 500 may also be configured to control one or more associated process devices and substrate handling devices in a lithocell or cluster of which the lithographic or exposure apparatus forms a part. The controller 500 can also be configured to be subordinate to a supervisory control system of a lithocell or cluster and/or an overall control system of a fab.

FIG. 2 depicts a schematic top view of the apparatus of FIG. 1 having self-emissive contrast devices 4. Like the apparatus 1 shown in FIG. 1, the apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
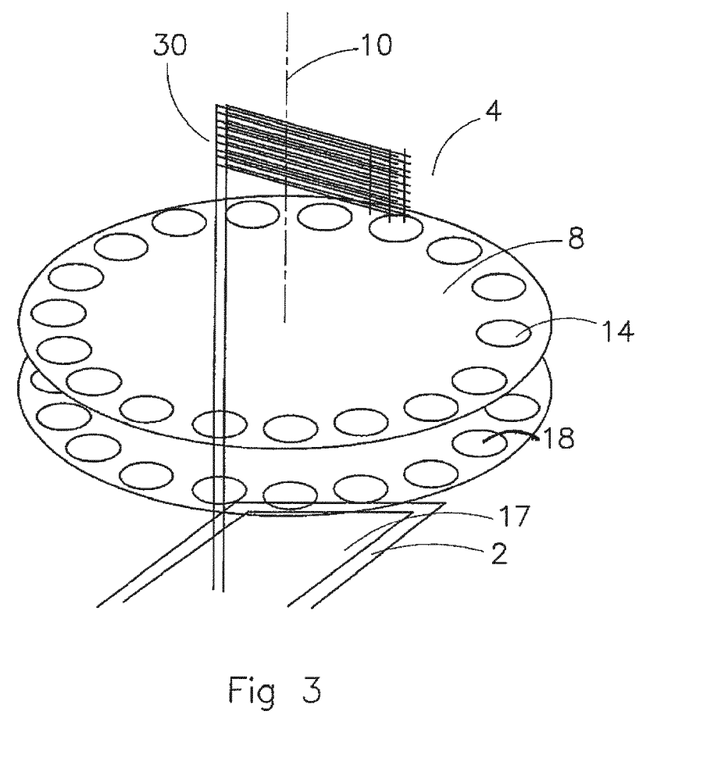
FIG. 3 depicts a highly schematic, perspective view of a part of a lithographic or exposure apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of, e.g., the substrate 17 held by the substrate table 2. In an embodiment, the plurality of beams is arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

As the rotatable frame rotates, the beams are incident on successive lenses. Each time a lens is irradiated by the beams, the places where the beam is incident on a surface of the lens, moves. The beams are projected on the target differently (with e.g. a different deflection) depending on the place of incidence of the beams on the lens. Hence the beams (when reaching the target) will make a scanning movement with each passage of a following lens. This principle is further explained with reference to FIG. 4.

Figure 4:
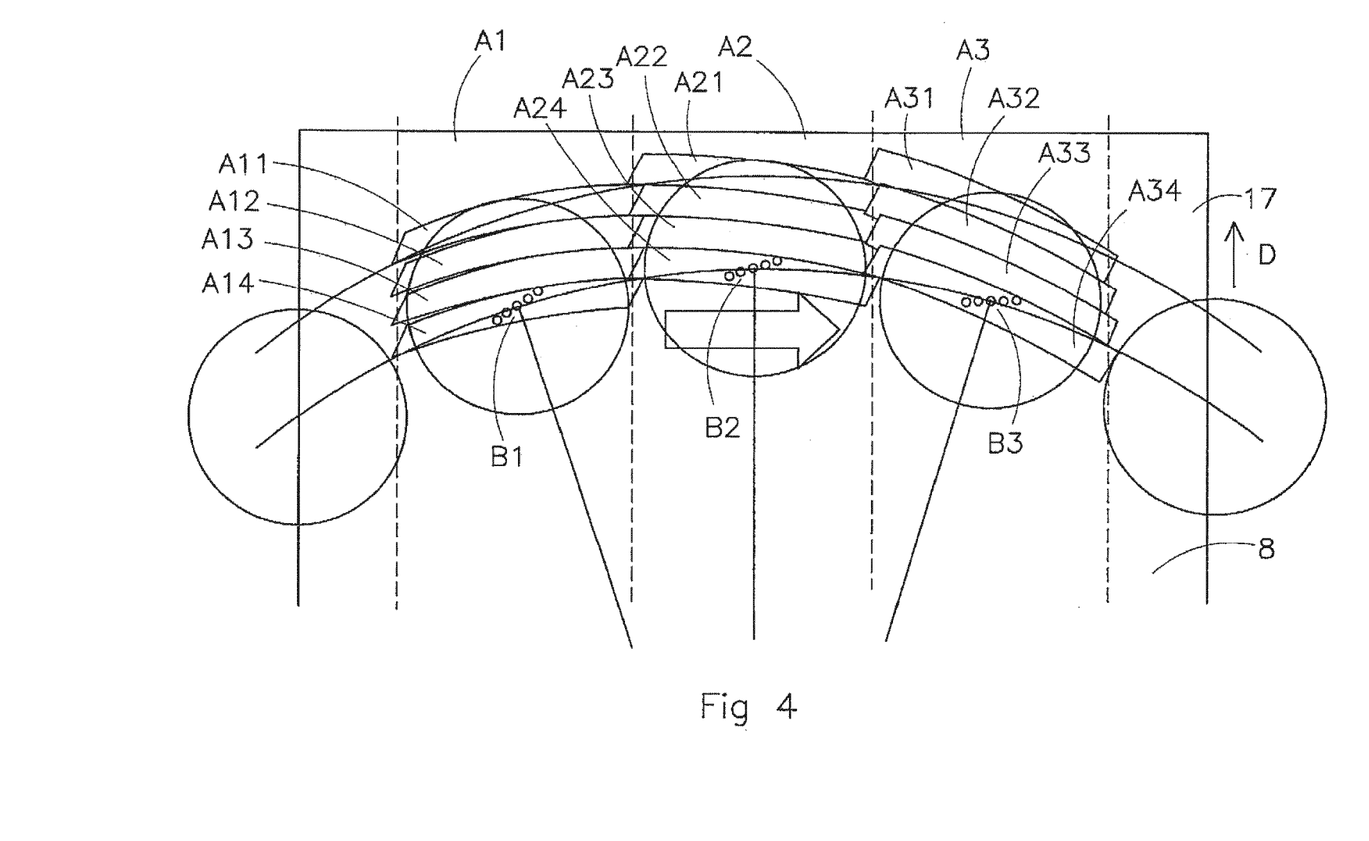
FIG. 4 depicts a schematic top view of projections by the apparatus according to FIG. 3 onto a target according to an embodiment of the invention.

FIG. 4 depicts a highly schematic top view of a part of the rotatable frame 8. A first set of beams is denoted by B1. A second set of beams is denoted by B2. A third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D. The direction D may be along the X axis as depicted in FIG. 2. The direction D may be substantially perpendicular to the scanning direction of the beams in the areas A14, A24, A34.

As a result of the movement in direction D by a second actuator (e.g. a movement of the substrate table by a corresponding substrate table motor), successive scans of the beams when being projected by successive lenses of the rotatable frame 8, are projected so as to substantially abut each other. This results in substantially abutting areas A11, A12, A13, A14 (areas A11, A12, A13 being previously scanned and A14 being currently scanned as shown in FIG. 4) for each successive scan of beams B1. Areas A21, A22, A23 and A24 (areas A21, A22, A23 being previously scanned and A24 being currently scanned as shown in FIG. 4) are for beams B2. Areas A31, A32, A33 and A34 (areas A31, A32, A33 being previously scanned and A34 being currently scanned as shown in FIG. 4) are for beams B3. Thereby, the areas A1, A2 and A3 of the substrate surface may be covered with a movement of the substrate in the direction D while rotating the rotatable frame 8.

The projecting of multiple beams through a same lens allows processing of a whole substrate in a shorter timeframe (at a same rotating speed of the rotatable frame 8). This is because for each passing of a lens, a plurality of beams scan the substrate 17 with each lens. This allows increased displacement in the direction D for successive scans. Viewed differently, for a given processing time, the rotating speed of the rotatable frame may be reduced when multiple beams are projected onto the substrate via a same lens. This possibly reduces effects such as deformation of the rotatable frame, wear, vibrations, turbulence, etc. due to high rotating speed.

In an embodiment, the plurality of beams is arranged at an angle to the tangent of the rotation of the lenses 14, 18 as shown in FIG. 4. In an embodiment, the plurality of beams is arranged such that each beam overlaps or abuts a scanning path of an adjacent beam.

A further effect of the aspect that multiple beams are projected at a time by the same lens may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers. Each of the beams is incident on a respective one of the fibers. The fibers are arranged so as to reduce a spacing between the beams along an optical path. As a result the beam spacing downstream of the optical fibers is less than the beam spacing upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided for controlling the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) by a laser induced material transfer.

Figure 5:
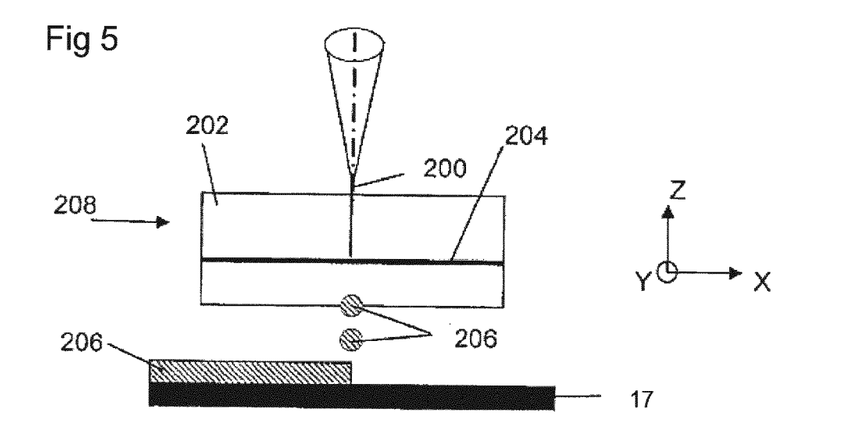
FIG. 5 depicts in cross-section, a part of an embodiment of the invention.

Referring to FIG. 5, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

FIG. 1 depicts an embodiment of the invention. The lithographic or exposure apparatus 1 comprises a projection system 50 that comprises a stationary part and a moving part. The projection system may comprise lenses 12, 14 and 18 as depicted in FIG. 1, for example. The projection system 50 is configured to project a plurality of radiation beams onto locations on a target (e.g., substrate 17). The locations are selected based on a pattern. The pattern is to be formed on the substrate 17. In an embodiment the pattern is formed in a layer of photoresist material. In an embodiment the pattern is formed in a layer of donor material, which subsequently forms a corresponding pattern in a layer of a device.

Figure 6:
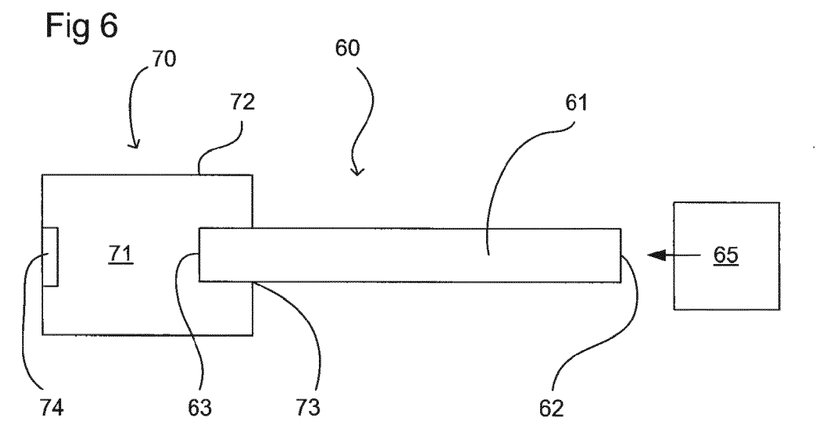
FIG. 6 depicts a schematic view of a device according to an embodiment of the invention.

Referring to FIG. 6, in an embodiment, a self emissive contrast device 4 comprises a device 60 that comprises a waveguide 61. In an embodiment the waveguide 61 comprises an optical fiber. The lifetime of an optical fiber and other waveguides formed of a continuous body of material is limited. It has been observed that there is a degradation in coupling efficiency at an end surface (i.e. the input surface and/or the output surface) of the optical fiber or other waveguide. It has been observed that the waveguide functions with good and stable coupling efficiency for a limited period of time, after which the output of the waveguide follows an approximately linear degradation. The coupling efficiency of a waveguide is related to the proportion of radiation that is transmitted into and out from the waveguide.

One way to lengthen the lifetime of an optical fiber is to provide an end cap on one or both ends of the optical fiber. A disadvantage of known end capping of optical fibers is that for approximately 10% of optical fibers, the optical fibers degrade undesirably quickly even with the end caps being used. Furthermore, mounting of an end cap is difficult. This is because a 100% contact between the end cap and the fiber is desired. If the contact is less than 100%, then this results in degradation as described above.

It is desirable to lengthen the lifetime of a device comprising a waveguide formed of a continuous body of material. In an apparatus 1 as described above, there may be of the order of about 10,000 devices each comprising a waveguide employed in the apparatus. Hence it is particularly desirable to lengthen the lifetime of a higher percentage than 90% of such devices reliably.

FIG. 6 schematically depicts a device 60 according to an embodiment of the invention. In an embodiment the device 60 comprises a waveguide 61 formed of a continuous body of material. The continuous body of material is transparent to radiation that passes through the waveguide 61. The body has an input surface 62 and an output surface 63. In an embodiment the waveguide is an optical waveguide such as an optical fiber. In an embodiment the optical fiber is a single mode optical fiber. In an embodiment the optical fiber is a polarization maintaining optical fiber.

In an embodiment the waveguide 61 has an elongated shape. The waveguide 61 may have a longitudinal direction, which corresponds to the axis of the waveguide 61. However, this need not necessarily be the case. For example, in an embodiment the waveguide has a planar shape. In this case the waveguide 61 may receive radiation and output radiation via any edge of the planar waveguide. In an embodiment, the waveguide 61 is not hollow. The waveguide 61 is substantially solid. In the case that the waveguide 61 has an elongated shape, the input surface 62 and the output surface 63 of the waveguide 61 are at the longitudinal ends of the waveguide 61.

In an embodiment the device 60 comprises a cooler 70. The cooler 70 is configured to cool the input surface 62 and/or the output surface 63.

When the device 60 is in use, the radiation that is received at the input surface 62 heats up the input surface 62. The radiation that passes through and is output from the waveguide 61 heats up the output surface 63. By providing the device 60 with a cooler 70, the temperature at the input surface 62 and/or the output surface 63 is reduced compared to a device that does not have such a cooler.

Cooling of the input surface 62 and/or the output surface 63 has the effect of increasing the lifetime of the device 60. This is because the degradation of the coupling efficiency of the waveguide is due to the end surfaces of the waveguide becoming deformed. The deformation of the end surfaces is caused at least partly by heat from the radiation. The radiation partially melts or softens the end surfaces, which deform.

In the art, it had previously been thought that the degradation of the coupling efficiency of the waveguide is due to a build up of contaminants at the end surfaces of the waveguide. Hence this discovery is a departure from the conventional thinking. Using electron microscopy it was observed that the black spots on the end surfaces of a waveguide are not due to contamination, but are in fact a deformed surface. This type of surface deformation may be termed laser induced periodic surface structures. This kind of deformation can occur in optical fibers even in particle deprived environments, in which significant contamination of the end surfaces of the optical fiber is not possible.

By reducing the temperature at the input surface 62 and/or the output surface 63, the generation of the periodic surface structures at the input surface 62 and/or at the output surface 63 is at least slowed down and possibly prevented.

In an embodiment the cooler 70 comprises a body of liquid 71 that cools the input surface 62 and/or the output surface 63. One or both of the end surfaces of the waveguide 61 may be immersed in the body of liquid 71. Heat is transferred from the input surface 62 and/or the output surface 63 to the body of liquid 71.

The body of liquid 71 provides a simple way for cooling the input surface 62 and/or the output surface 63. However, other types of cooler 70 may be used provided that they are configured to cool the input surface 62 and/or the output surface 63. In an embodiment the liquid 71 is not in contact with a side surface of the waveguide 61.

In an embodiment the liquid 71 is transparent to the radiation that passes through the waveguide 61. By providing that the body of liquid 71 is transparent to the radiation, no extra mechanism may be required to allow the waveguide 61 to receive and/or output the radiation while avoiding the body of liquid 71. Hence, the device 60 can have a simple construction.

The body of liquid 71 need not be perfectly transparent to the radiation. It is desirable for the body of liquid 71 to have at least a high level of transparency for the wavelength of radiation that the waveguide 61 is configured to guide. A transparency of at least 80%, and optionally at least 90% is desirable.

In an embodiment the liquid 71 comprises water. Water is readily available, cheap and non-corrosive. By using water for the liquid 71 of the cooler 70, the device 60 can be manufactured inexpensively and safely. However, other types of liquid 71 may be suitable for use in the cooler 70. The type of liquid 71 is not particularly limited. For example the liquid 71 may be ethanol. The liquid 71 may be any liquid that has a high transmission for 405 nm wavelength radiation.

In an embodiment the liquid 71 has a refractive index having a value that is between the refractive index of the waveguide 61 and the refractive index of the medium into which the device 60 emits radiation. In an embodiment the device 60 is configured to emit radiation into air, for example. In an embodiment the refractive index of the liquid 71 is greater than 1.

In an embodiment the liquid 71 has a refractive index that is less than the refractive index of the material from which the waveguide 61 is formed. For example, the waveguide 61 may be formed of a glass material having a refractive index in the region of about 1.5. In an embodiment the liquid has a refractive index in the range of from about 1 to about 1.5, and more desirably in the range of from about 1.2 to about 1.4. In an embodiment the liquid 71 has a refractive index which is the same as the refractive index of the material from which the waveguide 61 is formed. An advantage of this is that it reduces the optical effects from the surface deformations. In an embodiment the liquid 71 has a refractive index which is greater than the refractive index of the material from which the waveguide 61 is formed.

In an embodiment, the body of liquid 71 reduces the refractive index step between the waveguide 61 and the external environment. The body of liquid 71 provides an intermediate refractive index step. This improves the coupling efficiency of the waveguide 61 to the external medium (e.g. air or a vacuum). Additionally, the intermediate refractive index step provided by the body of liquid 71 can decrease distortion in the wavefront output from the waveguide 61. The body of liquid 71 reduces the negative effects of periodic surface structures that can form at an end surface of the waveguide 61. Furthermore, this index matching by the body of liquid 71 has a beneficial effect on the inhomogeneous energy deposition at the input surface 62 and/or output surface 63 of the waveguide 61 that results in the undesirable surface structures. The index matching reduces the heating at the input surface 62 and/or output surface 63 of the waveguide 61. In an embodiment a reflective coating is provided on the side of the waveguide 61.

In an embodiment the cooler 70 comprises a cap 72. The cap 72 is configured to hold the liquid 71 at the input surface 62 and/or at the output surface 63. The waveguide 61 receives the radiation and/or outputs the radiation through the liquid 71. The cap 72 is formed of a material that is impervious to the liquid 71. The liquid 71 is contained within the cap 72.

By providing the cap 72, the cooler 70 can have a simple construction to cool the input surface 72 and/or the output surface 63 of the waveguide 61. The volume capacity of the cap 72 is not particularly limited. In an embodiment the volume capacity of the cap is at least 50 ml and optionally at least 100 ml. In an embodiment the volume capacity of the cap 72 is in the region of about 1 ml. In an embodiment, a cooler 70 is shared by a plurality of waveguides 61. For example, in an embodiment a plurality of optical fibers each have an end surface in the same cap 72. The cap 72 may have a volume of from about 1 ml to about 10 ml. The heat from the input surface 62 and/or the output surface 63 is absorbed by the body of liquid 71 within the cap 72. The greater the volume of the body of liquid 71, the lower the average temperature increase of the body of liquid 71 due to absorbing the radiation. This helps to cool the input surface 62 and/or the output surface 63 of the waveguide 61.

The cap 72 has a port 73 configured to receive the waveguide 61. In an embodiment the port 73 comprises a seal configured to form a liquid-tight seal between the cap 72 and the waveguide 61. The seal at least reduces liquid loss from the cap 72 around the outer surface of the waveguide 61.

The shape of the cap 72 is not particularly limited. In an embodiment the cap 72 has an elongated shape. In an embodiment an average diameter of the cap 72 is greater than an average diameter of the waveguide 61. In an embodiment the cap 72 has a longitudinal direction. In an embodiment the longitudinal direction of the cap 72 is the same as the longitudinal direction of the waveguide 61.

In an embodiment the cap 72 comprises a window 74. The waveguide 61 receives the radiation and/or outputs the radiation through the liquid 71 and the window 74. The window 74 is made of a material that is substantially transparent to the radiation that the waveguide 61 is configured to guide. The window 74 is impervious to the liquid 71.

By providing the window 74, the rest of the material that forms the cap 72 that holds the liquid 71 can have any optical properties. This relaxes the requirements of the cap 72. For example, the rest of the cap 72, apart from the window 74, can be opaque to the radiation guided by the waveguide 61. However, the cap 72 does not necessarily need the window 74. For example, the cap 72 may be formed of a material that is transparent to the radiation guided by the waveguide 61. In this case, no additional window is required. Furthermore, in an embodiment the window 74 in the cap 72 is configured to shape the radiation beam that is output from the device 60. In an embodiment the window 74 in the cap 72 is configured to act as a pinhole or a lens.

Figure 7:
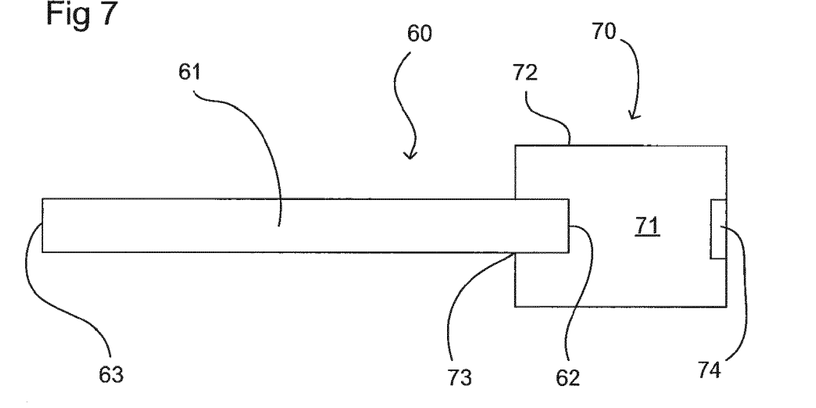
FIG. 7 depicts a schematic view of a device according to an embodiment of the invention.

As depicted in FIG. 6, the cooler 70 may be configured to cool the output surface 63 of the waveguide 61. FIG. 7 depicts schematically a device 60 according to an embodiment of the invention in which the cooler 70 is configured to cool the input surface 62 of the waveguide 61.

Figure 8:
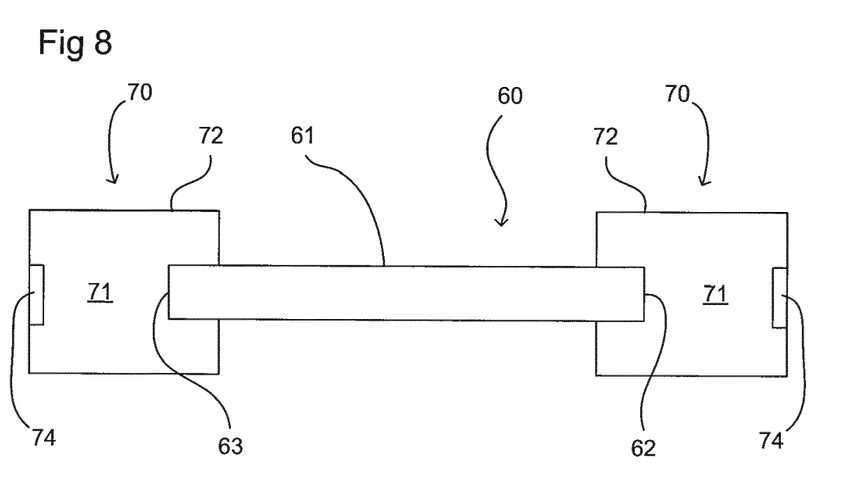
FIG. 8 depicts a schematic view of a device according to an embodiment of the invention.

FIG. 8 depicts an embodiment in which the device 60 comprises two coolers 70. One of the coolers is configured to cool the input surface 62. The other cooler 70 is configured to cool the output surface 63.

In an embodiment a radiation emitter comprises the device 60 according to an embodiment of the invention. In an embodiment a fiber laser comprises the device 60 according to an embodiment of the invention. For example, one or more of the self-emissive contrast devices 4 may comprise a fiber laser that comprises the device 60 according to an embodiment of the invention.

As depicted in FIG. 6, in an embodiment the device 60 comprises a radiation source 65. The radiation source 65 is configured to supply radiation to the waveguide 61. For example, the radiation source 65 may comprise a laser diode, or another fiber laser. The laser diode may be a semiconductor laser diode. In an embodiment the device 60 comprises part of a fiber laser that is pumped by a radiation source.

In an embodiment the radiation source 65 is configured to supply unpolarized and/or circularly polarized radiation to the waveguide 61. In an embodiment the radiation source 65 is configured to supply completely unpolarized radiation to the waveguide 61. In an embodiment the radiation source 65 is configured to supply wholly circularly polarized radiation to the waveguide 61. In an embodiment the radiation source 65 is configured to supply a mixture of unpolarized and circularly polarized radiation to the waveguide 61. In an embodiment the radiation source 65 is configured to supply radiation that comprises a maximum of 10%, 5% or 1% of linearly polarized radiation. However, this need not necessarily be the case. For example, in an embodiment the radiation source 65 of the device 60 is configured to supply at least some, and optionally wholly, linearly polarized radiation to the waveguide 61. The device 60 may be used with radiation of any polarization. The effect of the cooler 70 can reduce the generation of the undesirable surface structures such that linearly polarized radiation may be used without reducing the lifetime of the device 60.

In an embodiment the device 60 is configured to have an output of at least 50 mW. In an embodiment the device is configured to have an output power of at most 250 mW. In an embodiment the device 60 is configured to guide radiation having a wavelength of about 405 nm. However, the wavelength of the radiation guided by the waveguide 61 is not particularly limited. The device 60 may comprise part of a blue laser, a blue-violet laser or a violet laser, for example. However, other wavelengths of radiation can be used. This is because radiation of any wavelength can have an effect of heating up the input surface 62 and/or the output surface 63 of the waveguide 61, which can lead to deformation of the input surface 62 and/or the output surface 63. Hence, a device that comprises a waveguide to guide radiation of any wavelength can benefit from being made according to an embodiment of the present invention.

In an embodiment the waveguide 61 is configured to output the radiation into a gas from the output surface 63 via the cooler 70. In the context of the device 60 being used in a lithographic or exposure apparatus 1, the device 60 may comprise part of a self-emissive contrast device 4 configured to output radiation into air, or optionally into a vacuum. The cooler 70 of the device 60 increases the coupling efficiency from the waveguide 61 to the gas or vacuum, particularly after a period of time in which the coupling efficiency of the waveguide 61 is in any case stable.

Figure 9:
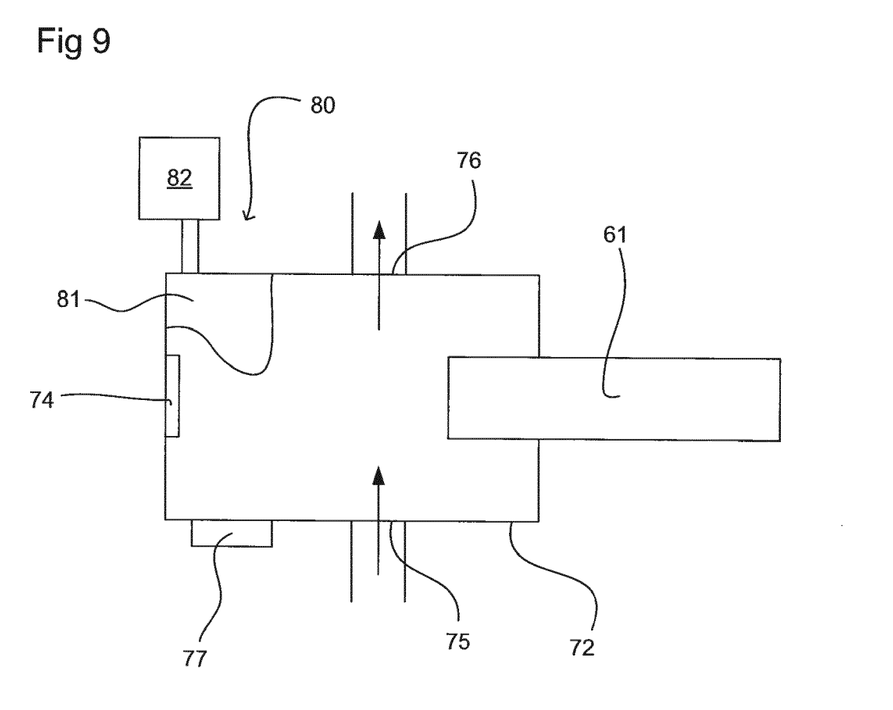
FIG. 9 depicts a schematic view of a part of a device according to an embodiment of the invention.

FIG. 9 depicts schematically a cooler 70 of a device 60 according to an embodiment of the invention. As depicted in FIG. 9, in an embodiment the cooler 70 comprises a pressuriser 80. The pressuriser 80 is configured to maintain the liquid 71 under pressure. In use, the liquid 71 is pressurized by the pressuriser 80.

An advantage of maintaining the liquid 71 under pressure in use is that the boiling point of the liquid 71 is effectively increased. This reduces the possibility of the liquid 71 boiling when the device 60 is in use. The liquid 71 absorbs heat from the input surface 62 and/or the output surface 63 of the waveguide 61 in use. It would be undesirable for the liquid 71 to boil because this would reduce the cooling effect of the liquid 71. In particular the cooling effect of the liquid 71 would be diminished if gas bubbles come into contact with the surface to be cooled. Furthermore a bubble can act as a lens that will decrease the coupling at an end surface of the waveguide 61.

The type of pressuriser 80 is not particularly limited. Merely by way of example, in an embodiment the pressuriser 80 may comprise a gas pocket 81 within the cap 72 of the cooler 70. The gas pocket 81 is filled with a gas such as air. The gas pocket 81 is separated from the body of liquid by a membrane that is at least partially flexible. The pressuriser 80 further comprises a compressor 82 configured to pressurize the gas in the gas pocket 81. By compressing the gas in the gas pocket 81, the liquid 71 in the cooler 70 may be pressurized.

In an embodiment the cooler 70 comprises a circuit such that the liquid 71 flows across the input surface 62 and/or the output surface 63. Such a circuit is depicted in FIG. 9 by the arrows, which indicate the movement of the liquid 71 through the cooler 70. By providing a flow of liquid 71 across the input surface 62 and/or the output surface 63, the average temperature of the liquid 71 that comes into contact with the input surface 62 and/or the output surface 63 can be maintained at a low level. This enables the liquid 71 to continue to cool the input surface 62 and/or the output surface 63. Once liquid 71 has absorbed heat, it can exit the cap 72 of the cooler 70. New liquid at a lower temperature flows into the cap 72 to replace the outflowing liquid 71.

In an embodiment the cooler 70 comprises a liquid supply opening 75 and a liquid outflow opening 76. Liquid 71 flows into the cap 72 of the cooler 70 via the liquid supply opening 75. Liquid 71 flows out from the cap 72 of the cooler 70 through the liquid outflow opening 76.

An advantage of providing a flow of the liquid 71 through the cooler 70 is that the flow of liquid 71 can help to purge contaminants that are present at the input surface 62 and/or the output surface 63. For example, such contaminants can otherwise be deposited at the surface 62, 63 due to an optical tweezer effect, resulting in contaminants particularly on the optical core of an optical fiber. The flow of the liquid 71 reduces the deposition from occurring at the beam focus. The flow, which may be perpendicular to the surface, moves particles that may be "trapped" due to the optical tweezer effect out of the optical beam before they have effectively traveled to the surface. Additionally, if contaminants are deposited at the surface, then the flow of the liquid 71 reduces the contaminants. Hence, the flow of the liquid 71 helps to reduce the negative effects of contaminants on an end surface of the waveguide 61.

In an embodiment the cooler 70 comprises a heater 77. The heater 77 is configured to heat to a temperature that is greater than a temperature of the input surface 62 and/or the output surface 63. The purpose of the heater 77 is to degas the liquid 71 in the cooler 70. This degassing helps to reduce the formation of bubbles at the input surface 62 and/or the output surface 63 of the waveguide 61. This improves the effectiveness of the cooler 70.

The type of heater 77 is not particularly limited. The heater 77 comprises a heating element. In an embodiment the heater 77 comprises a thin film heater attached to an outer surface or an inner surface of the cap 72 of the cooler 70. Other suitable types of heater 77 may be used.

Additionally or alternatively, the liquid 71 in the cooler 70 may be at least partially degassed by reducing the pressure of the liquid 71. For example, the liquid 71 may be degassed by reducing the pressure of the liquid 71 prior to use of the liquid 71 in the device 60. In this case, once the device 60 is in use, the pressure may be increased by using a pressuriser 80, for example, so as to increase the boiling point of the liquid 71.

In an embodiment a lithographic or exposure apparatus 1 comprises the device 60 according to an embodiment of the invention. In an embodiment the lithographic or exposure apparatus comprises a programmable patterning device that comprises a plurality of the devices 60, configured to provide a plurality of radiation beams. In an embodiment the lithographic or exposure apparatus comprises a projection system 50, comprising a stationary part and a moving part, configured to project the plurality of radiation beams onto locations on a target (e.g., a substrate 17) that are selected based on a pattern.

In an embodiment, there is provided a lithographic or exposure apparatus 1 comprising a programmable patterning device that comprises a plurality of self-emissive contrast devices 4, and a projection system 50 that comprises a stationary part and a moving part. In an embodiment at least one of the self-emissive contrast devices 4 comprises a waveguide 61 configured to output a radiation beam that comprises unpolarized and/or circularly polarized radiation. The at least one self-emissive contrast device 4 comprises a waveguide 61 configured to output only unpolarized and/or circularly polarized radiation. The waveguide 61 is configured to not output linearly polarized radiation.

By using only unpolarized and/or circularly polarized radiation, the lifetime of the self-emissive contrast device 4 can be increased. The degradation and deformation of an end surface of the waveguide 61 is decreased. This is because it has been observed that the periodic surface structures that can occur on the input surface 62 and/or the output surface 63 of the waveguide 61 form relative to the direction of linear polarization. In particular, it has been observed that the ripples of the deformation are perpendicular to the polarization of the radiation. In other words, the ripples have a preferential direction. By using circularly polarized radiation or unpolarized radiation, there is no linear polarization direction for the ripples of deformation to form relative to. This decreases the deformation of an end surface.

Experiments have been performed using an optical fiber having its end surfaces immersed in water. These experiments have shown that the shape of the radiation beam output by the optical fiber is not substantially distorted or dynamic, but remains relatively stable. Furthermore, the experiments have shown that the use of water immersion of the end surfaces of the optical fiber helps reduce the deterioration of the coupling efficiency between the optical fiber and the external medium over time.

Figure 10:
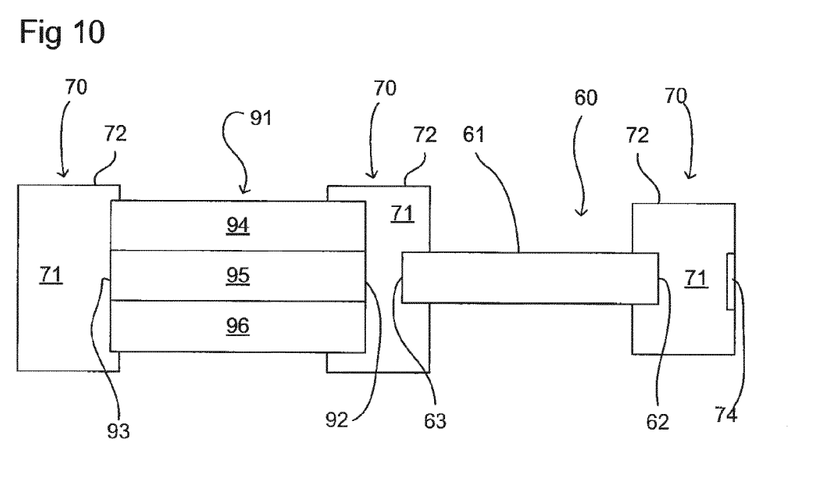
FIG. 10 depicts a schematic view of a device according to an embodiment of the invention.

FIG. 10 depicts an embodiment in which the device 60 comprises a slab waveguide 91. The slab waveguide may be termed a planar waveguide. The slab waveguide 91 has an input surface 92 and an output surface 93. A cooler 70 is configured to cool the input surface 92 and/or the output surface 93 of the slab waveguide 91.

In embodiment, the slab waveguide comprises at least three layers of material having different dielectric constants. A middle layer 95 is between a top layer 94 and a bottom layer 96. The different dielectric of the middle layer 95 is different from the dielectric constant of the top layer 94 and the dielectric constant of the bottom layer 96. Each of the at least three layers 94, 95, 96 extends in the directions substantially parallel to their interfaces.

In an embodiment the device 60 comprises at least two waveguides. For example, as depicted in FIG. 10, in an embodiment the device 60 comprises a slab waveguide 91 and another waveguide 61. In an embodiment the other waveguide 61 is an optical fiber. In an embodiment radiation is received by the slab waveguide 91 from the other waveguide 61 at an interface, which corresponds to the input surface 92 of the slab waveguide and/or the output surface 63 of the other waveguide 61. In an embodiment radiation is injected from the other waveguide 61 into the middle layer 95 of the slab waveguide 91. In an embodiment the input surface 92 of the slab waveguide 91 is in contact with the output surface 63 of the other waveguide 61. In an embodiment the input surface 92 of the slab waveguide 91 is spaced from the output surface 63 of the other waveguide 61.

A cooler 70 is configured to cool one or more surface selected from: the input surface 62 of the other waveguide, the output surface 63 of the other waveguide, the input surface 92 of the slab waveguide 91, and/or the output surface 93 of the slab waveguide 91. In an embodiment each of the input surface 62 of the other waveguide 61, the output surface 63 of the other waveguide 61, the input surface 92 of the slab waveguide 91 and the output surface 93 of the slab waveguide 91 is cooled by a cooler 70.

The device 60 according to an embodiment of the present invention can be used in a lithographic or exposure apparatus. However, the device 60 has many applications outside of lithography. For example, such a device 60 can be used in biosciences, particularly in or with a 405 nm laser. Other areas of application of the device 60 include medical diagnostics, environmental monitoring, micro-projectors and displays, telecommunications and other electronic equipment, for example. The device 60 may be of particular use in applications that involve a high power blue or violet laser.

In accordance with a device manufacturing method, a device, such as a display, integrated circuit or any other item may be manufactured from the substrate on which the pattern has been projected.

Although specific reference may be made in this text to the use of lithographic or exposure apparatus in the manufacture of ICs, it should be understood that the lithographic or exposure apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. A device comprising:
    a waveguide formed of a continuous body of material that is transparent to radiation that passes through the waveguide, wherein the body has an input surface and an output surface; and
    a cooler configured to cool the input surface and/or the output surface, wherein the cooler comprises an housing having a solid transparent portion other than a fiber, the solid transparent portion located opposite, and spaced apart, from the input surface and/or the output surface and wherein the cooler is configured to have cooling material directly contact the input surface and/or the output surface at a location between the solid transparent portion and the input surface and/or output surface.

2. The device of claim 1, wherein the waveguide comprises an optical fiber.

3. The device of claim 1, wherein the cooler comprises a body of liquid as the cooling material that cools the input surface and/or the output surface.

4. The device of claim 3, wherein the liquid is transparent to the radiation that passes through the waveguide.

5. The device of claim 3, wherein the liquid has a refractive index that is greater than 1 and less than a refractive index of the material.

6. The device of claim 3, comprising a pressuriser configured to maintain the liquid under pressure.

7. The device of claim 3, wherein the cooler comprises a circuit such that the liquid flows across the input surface and/or the output surface.

8. The device of claim 3, wherein the housing comprises a cap configured to hold the liquid at the input surface and/or at the output surface such that the waveguide receives the radiation and/or outputs the radiation through the liquid.

9. The device of claim 1, wherein the cooler comprises a heater configured to heat to a temperature that is greater than a temperature of the input surface and/or the output surface.

10. The device of claim 1, comprising a radiation source device configured to supply unpolarized and/or circularly polarized radiation to the waveguide.

11. The device of claim 1, configured to guide radiation having a wavelength of about 405 nm.

12. An exposure apparatus having a radiation emitter comprising the device of claim 1.

13. The apparatus of claim 12, comprising a projection system, comprising a stationary part and a moving part, configured to project a plurality of radiation beams onto locations on a target that are selected based on a pattern, wherein at least of one of the radiation beams is emitted by the radiation emitter.

14. The device of claim 1, wherein the waveguide comprises an optical slab waveguide.

15. The device of claim 1, comprising two coolers, one configured to cool the input surface and one configured to cool the output surface.

16. The device of claim 1, configured to have an output power of at most 250 mW.

17. The device of claim 1, configured to have an output power of at least 50 mW.

18. An exposure apparatus, comprising:
    a programmable patterning device that comprises a plurality of radiation emitters, configured to provide a plurality of radiation beams; and
    a projection system, comprising a stationary part and a moving part, configured to project the plurality of radiation beams onto locations on a target that are selected based on a pattern, wherein at least one of the radiation emitters comprises a waveguide configured to output at least one radiation beam of the plurality of radiation beams, the at least radiation beam comprising unpolarized and/or circularly polarized radiation and the at least one radiation beam not being patterned with an image.

19. A method for guiding radiation, the method comprising:

guiding radiation through a waveguide formed of a continuous body of material that is transparent to the radiation, wherein the body has an input surface and an output surface; and cooling the input surface and/or the output surface by having a cooling material directly contact the input surface and/or the output surface, wherein the cooling material is at a location between a solid transparent portion of a housing and the input surface and/or output surface, the solid transparent portion being other than a fiber and the solid transparent portion located opposite, and spaced apart, from the input surface and/or the output surface.

20. A device manufacturing method comprising:

providing a plurality of radiation beams from a plurality of radiation emitters of a programmable patterning device, wherein at least one radiation beam of the plurality of radiation beams comprises unpolarized and/or circularly polarized radiation; and projecting the plurality of radiation beams onto locations on a target that are selected based on a pattern, wherein at least one of the radiation emitters comprises a waveguide configured to output the at least one radiation beam, the at least radiation beam comprising unpolarized and/or circularly polarized radiation and the at least one radiation beam not being patterned with an image.

* * * * *